United States Patent [19]

Wu

[11] Patent Number: 5,989,977
[45] Date of Patent: Nov. 23, 1999

[54] SHALLOW TRENCH ISOLATION PROCESS

[75] Inventor: Shye-Lin Wu, Hu Kou Hsiang, Taiwan

[73] Assignee: Texas Instruments - Acer Incorporated, Hsinchu, Taiwan

[21] Appl. No.: 09/063,210

[22] Filed: Apr. 20, 1998

[51] Int. Cl.$^6$ .................................................. H01L 21/76
[52] U.S. Cl. ........................ 438/431; 438/424; 438/430; 438/700
[58] Field of Search .................................... 438/432, 424, 438/437, 426, 452, 700, 430, 431

[56] References Cited

U.S. PATENT DOCUMENTS

| | | | |
|---|---|---|---|
| 4,582,565 | 4/1986 | Kawakatsu | 438/431 |
| 4,666,556 | 5/1987 | Fulton et al. | 438/437 |
| 5,059,550 | 10/1991 | Tateoka et al. | 438/432 |
| 5,112,772 | 5/1992 | Wilson et al. | 438/432 |
| 5,116,779 | 5/1992 | Iguchi | 438/432 |
| 5,455,194 | 10/1995 | Vasquez et al. | 438/425 |
| 5,472,904 | 12/1995 | Figura et al. | 438/426 |
| 5,521,422 | 5/1996 | Mandelman et al. | |
| 5,591,681 | 1/1997 | Wristers et al. | 438/762 |
| 5,679,601 | 10/1997 | Wu | 438/446 |
| 5,780,346 | 7/1998 | Arghavani et al. | 438/296 |

OTHER PUBLICATIONS

Stanley Wolf and Richard N. Tauber "Silicon Processing for the VLSI Era", vol. 1, Process Technology, pp. 25, 187–191, 194, 206–207, 532, 546–551, 581, 1986.

Andres Bryant et al., Characteristics of CMOS Device Isolation for the ULSI Age, 1994 IEEE, pp. 671–674.

Asanga H. Perera et al., Trench Isolation for 0.45 μActive Pitch and Below, 1995 IEEE, pp. 679–682.

O. Joubert et al., Polysilicon Gate Etching in High–Density Plasmas: Comparison Between Oxide Hard Mask and Resist Mask, J. Electrochem. Soc., vol. 144, No. 5, May 1997, pp. 1854–1861.

Primary Examiner—Carl Whitehead, Jr.
Assistant Examiner—Maria Guerrero
Attorney, Agent, or Firm—Harness, Dickey & Pierce, P.L.C.

[57] ABSTRACT

The present invention proposes a method for fabricating shallow trench regions for isolation. An oxide hard mask is utilized for the silicon etching. A thick thermal oxide film is created at and near the trench corners to prevent the gate wrap-around and corner parasitic leakage. Forming trench regions on a semiconductor substrate by using a thick pad oxide layer as an etching hard mask. A thermal oxide film is grown to recover the etching damages. An undoped LPCVD amorphous silicon film is then deposited on entire surface of the semiconductor substrate. A high temperature/pressure oxidation process follows to convert the undoped amorphous silicon film into thermal oxide. A thick CVD oxide layer is deposited on the semiconductor substrate. The oxide film outside the trench regions is removed by using a CMP process. Finally, the MOS devices are fabricated on the semiconductor substrate by standard processes, and thus complete the present invention.

20 Claims, 3 Drawing Sheets

SHALLOW TRENCH ISOLATION PROCESS

BACKGROUND OF THE INVENTION

1. Field of the Invention

The present invention relates to a semiconductor device, and more especially, to a method for fabricating shallow trench isolation.

2. Description of the Prior Art

In the integrated circuit industry today, we usually build hundreds of thousands of semiconductor devices on a single chip. Every device on the chip must be electrically isolated to ensure that they operate independently without interfering with each other. The art of isolating semiconductor devices then becomes one important aspect of modern metal-oxide-semiconductor (MOS) and bipolar integrated circuit technology for the separation of different devices or different functional regions. With the high integration of the semiconductor devices, improper isolation among devices will cause current leakage, and the current leakage can consume a significant amount of power. Improper isolation also can exacerbate latch-up, which can damage the circuit temporarily or permanently. In addition, improper isolation can result in noise margin degradation, voltage shift and crosstalk.

Local oxidation of silicon (LOCOS) is one of the most well known techniques for isolation. LOCOS provides the isolation by oxidizing the silicon substrate to create silicon dioxide regions among active devices or functional regions. Because it is easy for the silicon substrate to be oxidized into silicon dioxide, LOCOS has the benefits of its process simplicity and low cost, and it becomes the most widely used isolation technique in very large scale integrated (VLSI) circuit. However, with the tendency for the manufacture of semiconductor integral circuit to high package density, LOCOS meets the limitation in its scalability.

The trench isolation, or, named the shallow trench isolation (STI), is another isolation technique developed especially for semiconductor chip with high integration. The trench regions are formed in the semiconductor substrate by recessing the substrate deep enough for isolation and refilling with insulating material to provide the isolation among active devices or different well regions. In general, trench isolation has a better scalability in comparison with LOCOS isolation.

In the paper "Characteristics of CMOS Device Isolation for the ULSI Age" in IEDM Tech. Dig., p. 671, 1994, by A. Bryant, et al., the two different isolation techniques of LOCOS and STI are investigated. The writers review how LOCOS and STI isolations are being improved to meet the scaling requirements for abrupt active-isolation transitions, isolation depth, and isolation planarity. For deep sub-micron CMOS generation, the conventional LOCOS isolation suffers from several drawbacks such as large lateral extend of bird's beak, non-planarity, local field oxide thinning effect, and stress-induced silicon defects. The key challenges to LOCOS scaling are insulator thinning at narrow dimension, bird's beak formation, and field-implant encroachment. For future CMOS technology, an effective device isolation method that provides abrupt transitions to active device regions with minimum impact on device characteristics or topography will be required. They come to the conclusions that, at the cost of a trench-fill and planarization, STI is a more direct method of meeting these requirements while benefiting from a significant advantage in planarity.

Another support to STI is given by A. H. Perera, et al., in "TRENCH ISOLATION for 0.45 $\mu$m ACTIVE PITCH and BELOW" in IEDM Tech. Dig., p. 679, 1995. They state that developing trench isolation appears expedient for technologies at and below the 0.25 $\mu$m size scale, due to the predictable scalability of the technique. And, while trench technology is more complex than simple LOCOS isolation, it is of comparable complexity to advanced LOCOS techniques.

Trench isolation develops to be a better isolation technique in deep sub-micron CMOS generation due to the advantages in its scalability, planarity, and isolation depth. But it still encounters several problems such as silicon damage induced by etching and the corner effects. As mentioned by J. A. Mandelman, et al., in the U.S. pat. No. 5,521,422 entitled "CORNER PROTECTED SHALLOW TRENCH ISOLATION DEVICE", the parasitic leakage path results from an enhancement of the gate electric field near the trench corner. Even worse, the gate conductor could wrap around the trench corner. They propose for above situation a trench isolation structure with a sidewall around. With this sidewall trench structure, the corner parasitic leakage and the gate wrap-around could be solved.

SUMMARY OF THE INVENTION

A method for fabricating shallow trench regions on a semiconductor substrate is disclosed. An oxide hard mask is utilized for the silicon etching to form the trenches. A thick thermal oxide film is created at and near the trench corners to prevent the corner effect such as the gate wrap-around and corner parasitic leakage.

Forming a thick pad oxide layer on a semiconductor substrate, the trench region and active area are defined by a photoresist photolithography followed by an anisotropic pad oxide etching. The semiconductor substrate is recessed to form trenches by another dry etching using the pad oxide layer as a mask. After removing the pad oxide layer, a thermal oxide film is regrown in $N_2O$ or NO ambient to recover the etching damages. An undoped LPCVD amorphous silicon film is then deposited on entire surface of the semiconductor substrate. A high temperature/pressure oxidation process follows to convert the undoped amorphous silicon film into thermal oxide. A thick CVD oxide layer, which is formed of TEOX-oxide or BPSG, etc., is deposited on the semiconductor substrate. The oxide film outside the trench regions is removed by using a CMP process. Finally, the MOS devices are fabricated on the semiconductor substrate by standard processes, and thus complete the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate shallow trenches for isolation. The method described here includes many process steps well known in the art like photolithography, etching or chemical vapor deposition (CVD) which are not discussed in detail. In addition, the present invention utilizes an oxide hard mask instead of resist mask for the silicon etching to form the trenches. And, a thick thermal oxide film is created to prevent the corner effect such as the gate wrap-around and corner parasitic leakage.

Figure 1:
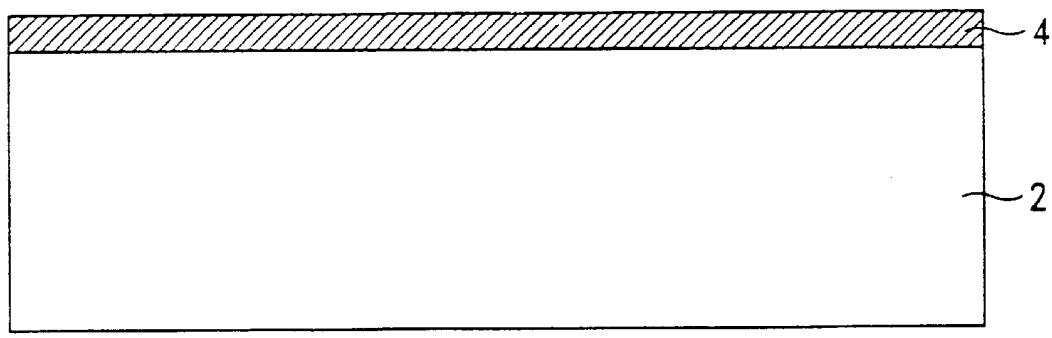
FIG. 1 is a cross-sectional view of a semiconductor wafer illustrating the step of forming a pad oxide layer on the substrate according to the present invention.

Referring to FIG. 1, a single crystal silicon substrate 2 with a <100> crystallographic orientation is provided. A thick silicon oxide layer 4 is formed on the surface of the substrate 2 to serve as an etching mask later. This silicon oxide layer 4 has a thickness of about 300–2000 angstroms, and can be grown from the semiconductor substrate 2 by using thermal oxidation in a dry or wet oxygen containing ambient at a temperature of about 800–1100° C. Alternatively, this silicon oxide layer 4 can be deposited by using low pressure chemical vapor deposition (LPCVD) at a temperature of about 400–750° C.

Figure 2:
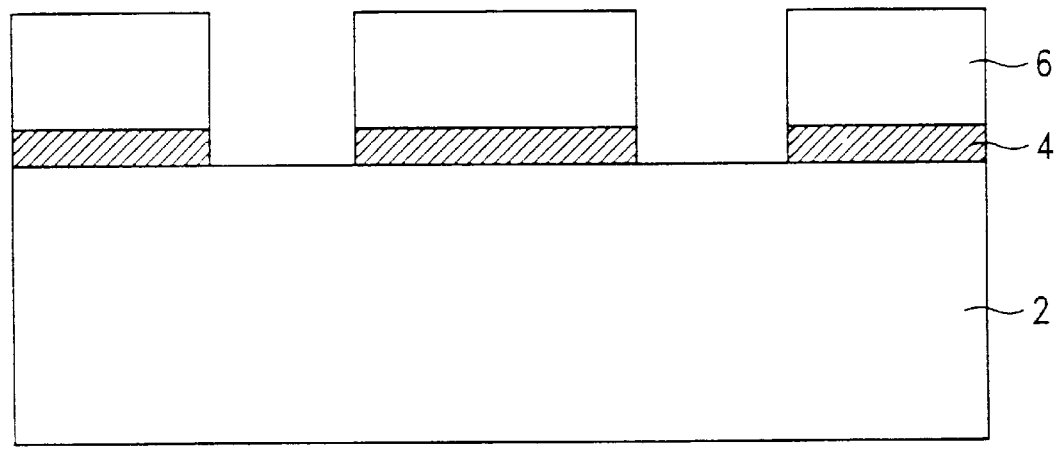
FIG. 2 is a cross-sectional view of a semiconductor wafer illustrating the step of defining the trench regions on the substrate by patterning a photoresist and etching the pad oxide layer according to the present invention.

Turning next to FIG. 2, the photoresist 6 with the trench pattern is now formed on the silicon oxide layer 4. This trench pattern is defined by using a conventional manner of photolithography including photoresist coating, exposure, and development processes. A dry etching process is then performed to etch the thick silicon oxide layer 4 and expose the trench regions of the semiconductor substrate 2. A reactive ion etching (RIE) with plasma gases containing fluoride such as $CF_4$, $CHF_3$, $C_2F_6$ or $C_3F_8$ is preferable for this anisotropic etching.

Figure 3:
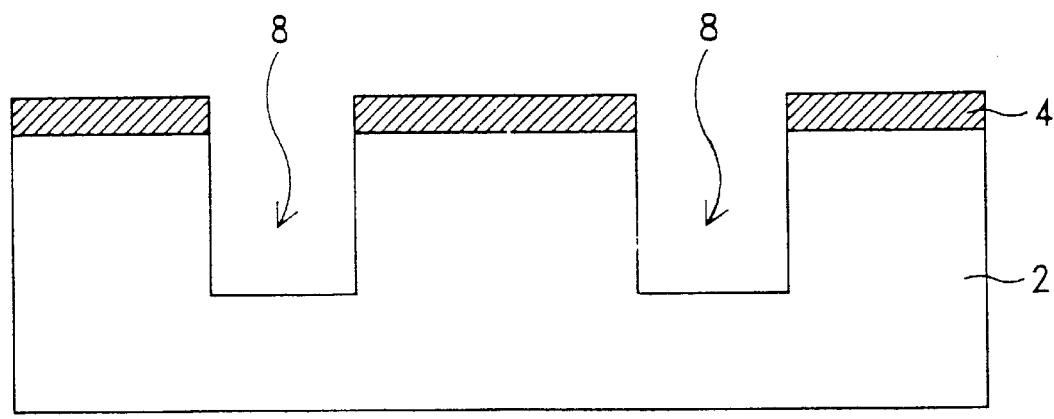
FIG. 3 is a cross-sectional view of a semiconductor wafer illustrating the step of recessing the silicon substrate to form shallow trenches according to the present invention.

Turning next to FIG. 3, after the photoresist 6 is removed and wet cleaned, another dry etching using $Cl_2$, $BCl_3$, HBr, $SF_6$ or $SiCl_4$ as the plasma source is carried out. At this anisotropic etching step, the exposed portion of the semiconductor substrate 2 is recessed to form the trenches 8 with a depth deep enough for isolation. As suggested by O. Joubert and F. H. Bell in their paper "Polysilicon Gate Etching in High-Density Plasma: Comparison Between Oxide Hard Mask and Resist Mask" in J. Electrochem. Soc., Vol. 144, p. 1854 at 1997, the patterned thick pad oxide layer 4 is used here as an etching hard mask instead of a resist mask. By the use of the oxide mask, the carbon contamination can be reduced, and the silicon etching process can be developed without creating structure defects.

Figure 4:
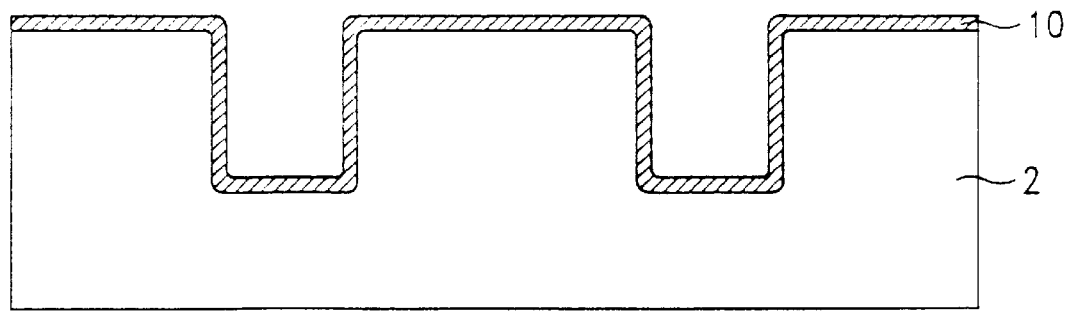
FIG. 4 is a cross-sectional view of a semiconductor wafer illustrating the step of removing the pad oxide layer and growing a thermal oxide on the substrate according to the present invention.
Figure 5:
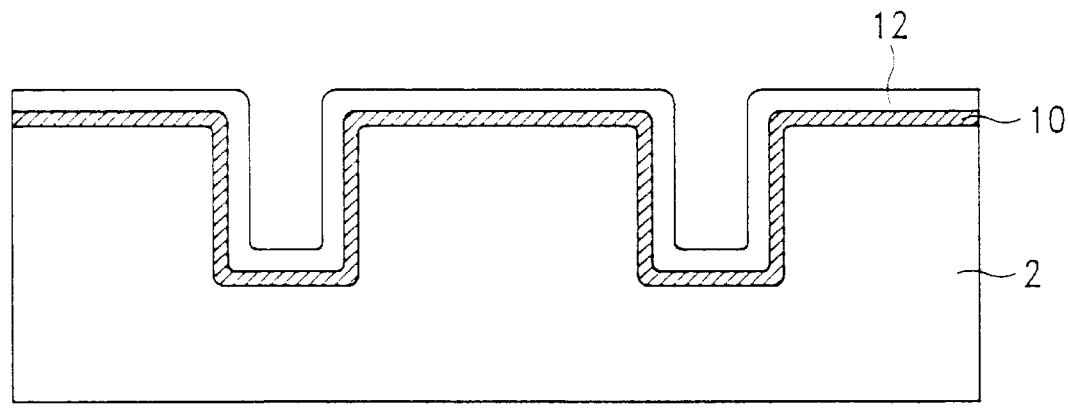
FIG. 5 is a cross-sectional view of a semiconductor wafer illustrating the step of depositing an undoped amorphous silicon layer on the substrate according to the present invention.

Referring to FIG. 4, the thick pad oxide layer 4 is removed by using buffered oxide-etching (BOE) solution or diluted solution of hydrofluoric acid (HF) as the etchant. A thermal oxynitride film 10 is regrown over the semiconductor substrate 2 by a thermal process in a $N_2O$ or NO ambient at a temperature of about 700–1150° C. The damages induced on the substrate surface by previous dry etching process are recovered through this thermal process and the trench corners are rounded simultaneously. Thereafter, an undoped amorphous silicon film 12 is deposited conformally on all area of the semiconductor substrate 2 and shown in FIG. 5. This amorphous silicon film 12 is preferably formed by a low pressure chemical vapor deposition (LPCVD) at a temperature of about 400–560° C. with a thickness of about 200 to 1000 angstroms.

Figure 6:
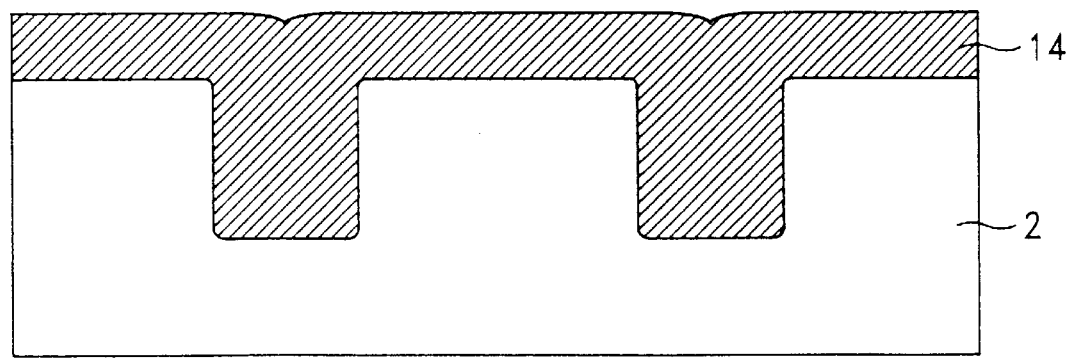
FIG. 6 is a cross-sectional view of a semiconductor wafer illustrating the step of performing a thermal oxidation to convert the undoped amorphous silicon layer into thermal oxide on the substrate and refilling the trenches according to the present invention.

Next, referring to FIG. 6, a high temperature oxidation process is performed in a high-pressure oxygen environment. At this step, the amorphous silicon film 12 is converted into thermal oxide layer 14. The thermal oxide layer 14 is grown and fills the trench regions, but not extends into the substrate because the thermal oxynitride layer 10 can prevent oxygen from penetration. The temperature employed by this thermal oxidation are about 800–1100° C.

Figure 7:
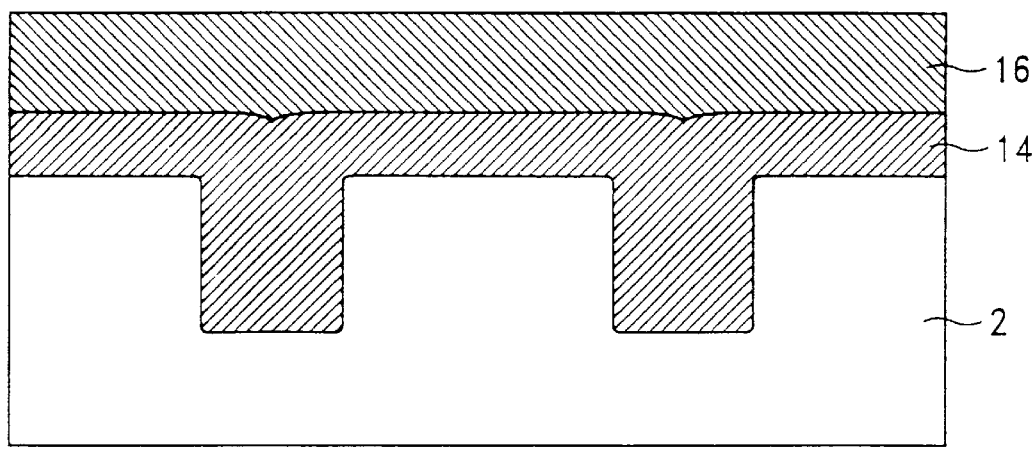
FIG. 7 is a cross-sectional view of a semiconductor wafer illustrating the step of depositing a CVD oxide on the substrate according to the present invention.

A thick oxide layer 16 is now optionally deposited over the semiconductor substrate 2 as shown in FIG. 7. The suitable method for forming this thick oxide layer 16 can be LPCVD, PECVD (plasma-enhanced CVD) or HDPCVD (high-density plasma CVD) with the material of tetra-ethyl-ortho-silicate-oxide (TEOS-oxide), boro-phospho silicate glass (BPSG), phospho silicate glass (PSG), boro silicate glass, (BSG), or undoped silicate glass (USG). By this thick oxide deposition, the surface of the semiconductor substrate 2 can be planarized, and the dishing effect induced by next etch-back process can be minimized.

Figure 8:
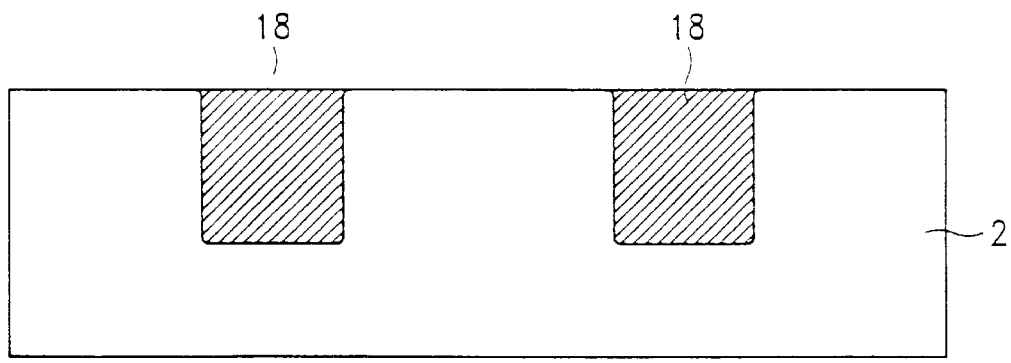
FIG. 8 is a cross-sectional view of a semiconductor wafer illustrating the step of etching back the CVD oxide and the thermal oxide outside the trench regions according to the present invention.

Now referring to FIG. 8, the CVD oxide film 16, and the portion of the thermal oxide layer 14 which exceeds the trenches regions in the semiconductor substrate 2, are stripped. The preferable method for this step can be chemical mechanical polishing (CMP) process for the global planarization that it can provide. Because the thermal oxide 14 is thickly grown over the trenches and the surfaces of the active regions, the same polishing rate is approximately kept at and near the trench corners, and the corner effects such as the gate wrap-around and the corner parasitic leakage can be improved. The trenching isolation regions 18 with planarized surface are thus accomplished.

Figure 9:
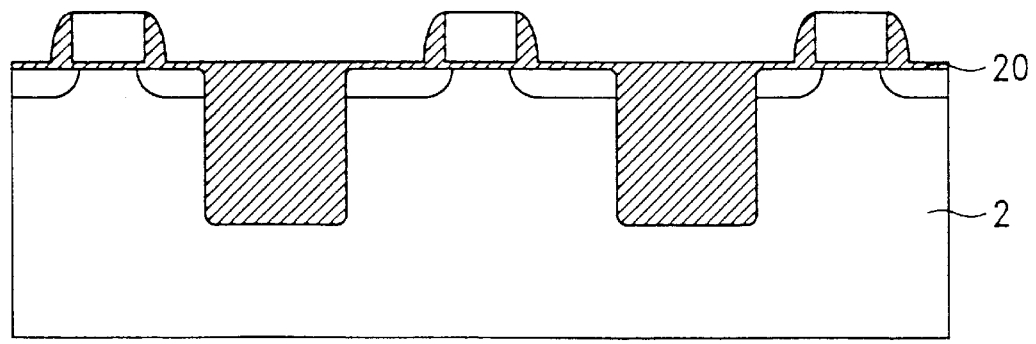
FIG. 9 is a cross-sectional view of a semiconductor wafer illustrating the step of fabricating MOSFET on the substrate according to the present invention.

Finally, referring to FIG. 9, the gate oxide layer 20 is regrown on the semiconductor substrate 2. Thereafter, the active devices that consist of gates, sources and drains are formed on the active regions to finish the fabrication of the CMOS transistor.

According to above processes, the trench regions 18 are formed in a semiconductor substrate 2 to provide isolation among active devices. The silicon damages induced by dry etching process would be reduced through long high temperature oxidation anneal. The trench regions have rounded top and bottom corners without suffering from corner effects such as the gate wrap-around and the corner parasitic leakage. By solving these problems raised from conventional trench isolation technique, the integration of semiconductor fabrication can be greatly increased, and the method of the present invention can be applied in deep sub-micron or smaller CMOS devices.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming trench regions in a semiconductor substrate, said method comprises:

opening trench regions in said semiconductor substrate;

performing a first oxidation to form a first oxide layer on the surface of said semiconductor substrate and said trench regions;

forming an undoped amorphous silicon layer on said first oxide layer;

performing a second oxidation to substantially completely convert said undoped amorphous silicon layer into second oxide layer, thereby filling said trench regions with said second oxide layer;

depositing a third silicon oxide layer on said second oxide layer; and removing said third silicon oxide layer and portions of said first and second oxide layers which exceed said trench regions.

2. The method according to claim 1, wherein said first oxidation is performed in an ambient selected from the group consisting of $N_2O$ ambient and NO ambient.

3. The method according to claim 1, wherein said third oxide layer is formed of a material selected from the group consisting of tetra-ethyl-ortho-silicate-oxide (TEOS-oxide), boro-phospho silicate glass (BPSG), phospho silicate glass (PSG), boro silicate glass (BSG), and undoped silicate glass (USG).

4. The method according to claim 1, wherein said third oxide layer and said exceeded portions of said first and second oxide layers are removed by a chemical mechanical polishing (CMP) process.

5. The method according to claim 1, further comprising the following steps to form said trench regions:

forming a pad oxide layer on said semiconductor substrate;

patterning a photoresist on said pad oxide layer to define trench regions of said semiconductor substrate;

etching said pad oxide layer to expose a portion of said semiconductor substrate which defines said trench regions of said semiconductor substrate, said etching uses said patterned photoresist as an etching mask;

etching said semiconductor substrate using said patterned pad oxide layer as an etching mask to form trench regions in said semiconductor substrate; and removing said patterned pad oxide layer.

6. The method according to claim 5, wherein said pad oxide layer is patterned by an anisotropic etching using a plasma source selected from the group consisting of $CF_4$, $CHF_3$, $C_2F_6$ and $C_3F_8$.

7. The method according to claim 5, wherein said trench regions are recessed by an anisotropic etching using a plasma source selected from the group consisting of $Cl_2$, $BCl_3$, $Hb_r$, $SF_6$ and $SiCl_4$.

8. The method according to claim 5, wherein said pad oxide layer is removed by using an etchant selected from the group consisting of buffered oxide-etching (BOE) solution and diluted solution of hydrofluoric acid (HF).

9. A method for forming trench regions in a semiconductor substrate, said method comprising:

opening trench regions in the semiconductor substrate;

performing a first oxidation to form a silicon oxynitride layer on the surface of the semiconductor substrate and said trench regions;

forming an undoped amorphous silicon on said silicon oxynitride layer;

performing a second oxidation to substantially completely convert said undoped amorphous silicon into second oxide layer, thereby filling said trench regions with said second oxide layer;

depositing a third silicon oxide layer on said second oxide layer; and removing said third silicon oxide layer, portions of said silicon oxynitride layer and said second oxide layer which exceed said trench regions, by a chemical mechanical polish.

10. The method according to claim 9, wherein said third oxide layer is formed of a material selected from the group consisting of tetra-ethyl-ortho-silicate-oxide (TEOS-oxide), boro-phospho silicate glass (BPSG), phospho silicate glass (PSG), boro silicate glass (BSG), and undoped silicate glass (USG).

11. The method according to claim 9, wherein said first oxidation is performed in an ambient selected from the group consisting of $N_2O$ ambient and NO ambient.

12. The method according to claim 9, further comprising the following steps to form the trench regions:

forming a pad oxide layer on said semiconductor substrate;

patterning a photoresist on said pad oxide layer to define trench regions of said semiconductor substrate;

etching said pad oxide layer to expose a portion of said semiconductor substrate which defines said trench regions of said semiconductor substrate, said etching using said patterned photoresist as an etching mask;

etching said semiconductor substrate using said patterned pad oxide layer as an etching mask to form trench regions in said semiconductor substrate; and removing said patterned pad oxide layer.

13. The method according to claim 12, wherein said pad oxide layer is patterned by an anisotropic etching using a plasma source selected from the group consisting of $CF_4$, $CHF_3$, $C_2F_6$ and $C_3F_8$.

14. The method according to claim 12, wherein said trench regions are recessed by an anisotropic etching using a plasma source selected from the group consisting of $Cl_2$, $BCl_3$, HBr, $SF_6$ and $SiCl_4$.

15. The method according to claim 12, wherein said pad oxide layer is removed by using an etchant selected from the group consisting of buffered oxide-etching (BOE) solution and diluted solution of hydrofluoric acid (HF).

16. A method for forming trench regions in a semiconductor substrate, said method comprises:

forming a pad oxide layer on said semiconductor substrate;

patterning a photoresist on said pad oxide layer to define trench regions of said semiconductor substrate;

etching said pad oxide layer to expose a portion of said semiconductor substrate which defines said trench regions of said semiconductor substrate, said etching uses said patterned photoresist as an etching mask, wherein said pad oxide layer is patterned by an anisotropic etching using a plasma source selected from the group consisting of $CF_4$, $CHF_3$, $C_2F_6$ and $C_3F_8$;

etching said semiconductor substrate using said patterned pad oxide layer as an etching mask to form trench regions in said semiconductor substrate;

removing said patterned pad oxide layer;

performing a first oxidation to form a silicon oxynitride layer on the surface of said semiconductor substrate and said trench regions;

forming an undoped amorphous silicon layer on said silicon oxynitride layer;

performing a second oxidation to substantially completely convert said undoped amorphous silicon layer into second oxide layer, thereby filling said trench regions with said second oxide layer;

depositing a third silicon oxide layer on said second oxide layer; and removing said third silicon oxide layer, portions of said silicon oxynitride layer and said second oxide layers which exceed said trench regions, by a chemical mechanical polish.

17. The method according to claim 16, wherein said trench regions are recessed by an anisotropic etching using a plasma source selected from the group consisting of $Cl_2$, $BCl_3$, HBr, $SF_6$ and $SiCl_4$.

18. The method according to claim 16, wherein said first oxidation is performed in an ambient selected from the group consisting of $N_2O$ ambient and NO ambient.

19. The method according to claim 16, wherein said pad oxide layer is removed by using an etchant selected from the group consisting of buffered oxide-etching (BOE) solution and dilute solution of hydrofluoric acid (HF).

20. The method according to claim 16, wherein said third oxide layer is formed of a material selected from the group consisting of tetra-ethyl-ortho-silicate-oxide (TEOS-oxide), boro-phospho silicate glass (BPSG), phospho silicate glass (PSG), boro silicate glass (BSG), and undoped silicate glass (USG).

* * * * *